United States Patent
Kim et al.

(10) Patent No.: US 6,246,588 B1
(45) Date of Patent: Jun. 12, 2001

(54) COMPUTER MOTHERBOARD USING OPPOSITELY CONFIGURED MEMORY MODULE SOCKETS

(75) Inventors: Jason S. Kim, Campbell; Richard T. Hsu, Milpitas, both of CA (US)

(73) Assignee: Acer Incorporated, Taipei (TW)

( * ) Notice: Subject to any disclaimer, the term of this patent is extended or adjusted under 35 U.S.C. 154(b) by 0 days.

(21) Appl. No.: 09/118,175

(22) Filed: Jul. 17, 1998

(51) Int. Cl.$^7$ .................................................. H01R 23/68
(52) U.S. Cl. .............................. 361/786; 361/413; 439/74
(58) Field of Search .................................. 361/760, 736, 361/803, 790, 788, 785, 786; 439/160, 64, 157, 540, 74, 326, 327, 328, 65, 69; 365/63, 52; 257/723, 686

(56) References Cited

U.S. PATENT DOCUMENTS 4,472,765 * 9/1984 Hughes ................................ 361/413
5,882,211 * 3/1999 Choy et al. ............................. 439/74

* cited by examiner

*Primary Examiner*—Jeffrey Gaffin
*Assistant Examiner*—Thanh Y. Tran
(74) *Attorney, Agent, or Firm*—Townsend and Townsend and Crew LLP

(57) ABSTRACT

An improved motherboard layout uses DIMM sockets in complementary pairs where the sockets have keys are in opposite locations. In essence, the first and second sockets in a pair are mirror images of each other. The sockets can be configured for single DIMMs (single-decker) or can be configured in a double-decker configuration. In circuit board layouts where both sockets are mounted on the same side of the motherboard, the sockets are disposed with their module-receiving recesses facing toward or away from each other, rather than in the same direction as in the prior art configuration. The complementary sockets can be disposed on opposite sides of the motherboard. In this type of layout, the respective keys are immediately opposite each other.

20 Claims, 6 Drawing Sheets

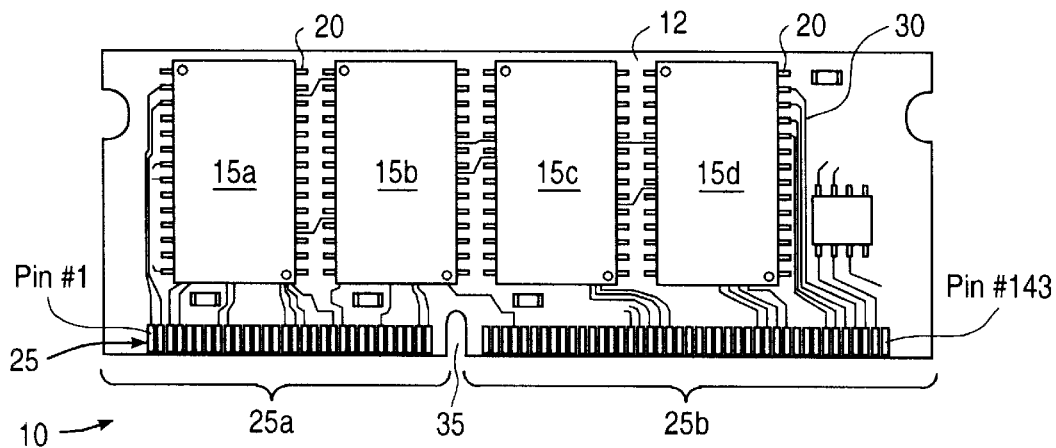
FIG. 1A (PRIOR ART)
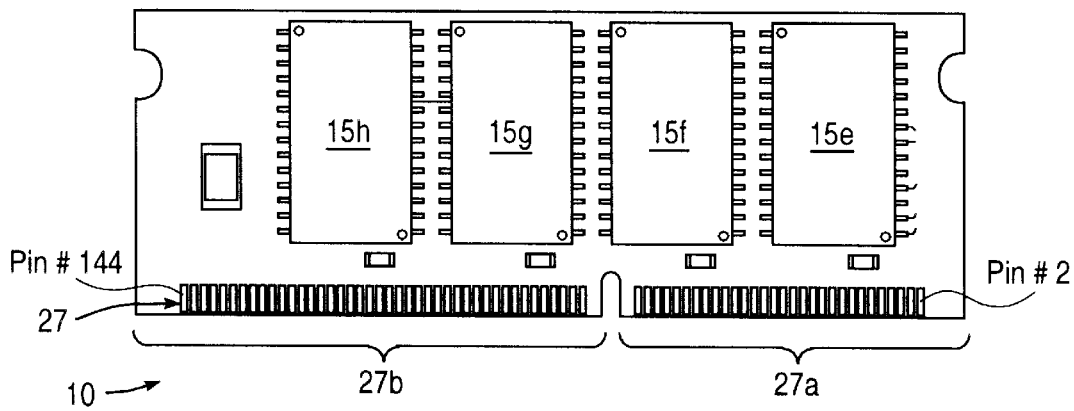
FIG. 1B (PRIOR ART)
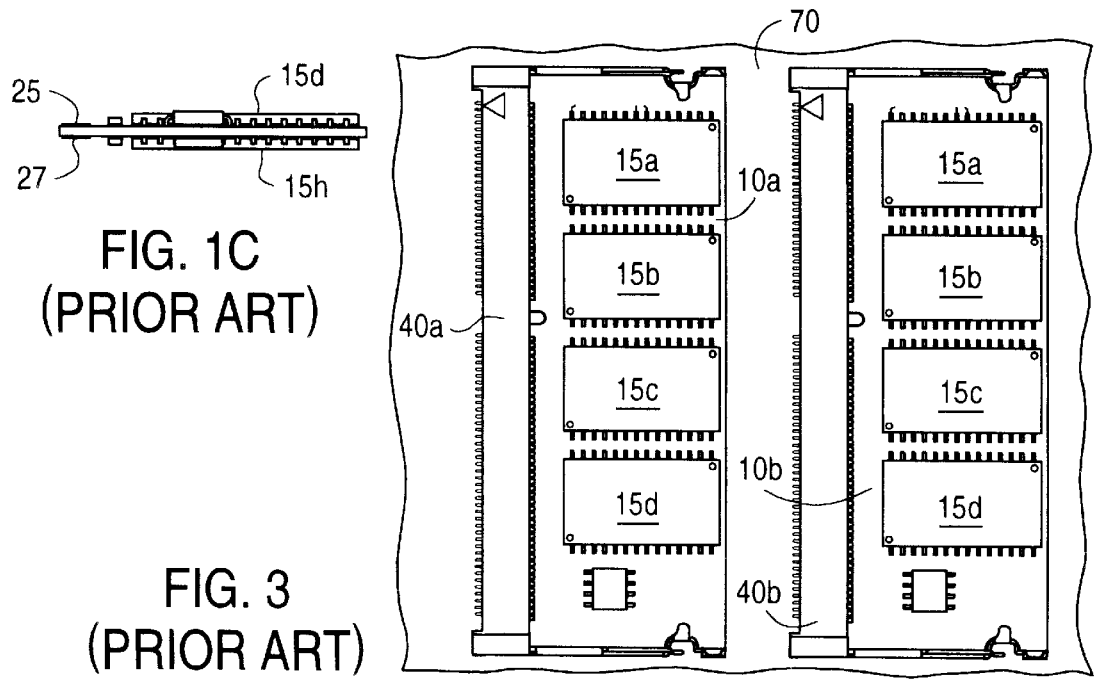
FIG. 1C (PRIOR ART)
FIG. 3 (PRIOR ART)

COMPUTER MOTHERBOARD USING OPPOSITELY CONFIGURED MEMORY MODULE SOCKETS

BACKGROUND OF THE INVENTION

This invention relates generally to circuit boards and sockets for mounting devices and modules thereon, and more specifically to techniques for mounting memory modules such as dual in-line memory modules (DIMMs).

It is well known to implement system (main) memory in computer systems, including personal computers and workstations, using memory modules having an industry-standard configuration. In short, a memory module for system memory typically includes a number of dynamic random access memory (DRAM) chips mounted on a small circuit board having edge contacts configured to engage complementary contacts in a socket. The module socket is mounted to a circuit board, which may be a main system board (motherboard), or a memory board that is itself mounted to a socket on the motherboard.

Recent industry-standard module configurations have included single in-line memory modules (SIMMs) and dual in-line memory modules (DIMMs). SIMMs have the memory chips on one side of the circuit board while DIMMs have memory chips on both sides of the circuit board. There are also memory modules for external cache memory using faster static random access memory (SRAM) chips rather than DRAM chips.

Although the memory chips themselves are subject to frequent changes, such as increases in capacity and speed, it is common practice to establish a number of standard mechanical configurations or form factors so that the number of different types of sockets remains relatively stable. In most desktop applications, the sockets are configured so that the DIMMs are perpendicular to the memory board or the motherboard. In laptop computer applications, where height above the motherboard is at a premium, the sockets are configured so that the DIMMs, when seated, are parallel to the motherboard FIGS. 1A, 1B, and 1C are simplified top, bottom, and side views of a prior art DIMM 10. The designation of orientation will be with reference to a horizontal motherboard. In the particular configuration, the DIMMs are mounted horizontally (i.e., parallel to the motherboard). As can be seen, DIMM 10 includes a circuit board 12 on which are mounted memory chips. There are can be different numbers of chips on a DIMM (say two, four, or eight). A common configuration, shown here as a concrete example, has eight chips, here designated 15a–15d (top) and 15e–15h (bottom). The chips have pins 20, which are electrically connected to a set of upper edge contacts 25 and a set of lower edge contacts 27 on circuit board 12 by a series of conductive traces 30, only a few of which are shown. In accordance with standard multilayer board practice, some of the conductive traces are on one of the outer surfaces of the circuit board and some are on a buried layer.

The edge contacts on the DIMMs are often referred to as pins. The particular DIMM illustrated has 144 pins, with odd-numbered pins #1, #3, . . . #143 on top, and even-numbered pins #2, #4, . . . #144 on the bottom.

The upper pins are offset relative to the lower pins, so that pin #2 is between pins #1 and #3, and pin #143 is between pins #142 and #144, taken in the direction of the edge along which the pins are disposed. Other standard DIMM pin configurations include 112, 128, 144, 160, 168, and 200 pins.

The DIMM and its socket are keyed in order to prevent the DIMM from being inserted into the socket upside down and to prevent an incompatible DIMM from being inserted into the socket. Specifically, circuit board 12 is formed with a non-symmetrically located notch 35 that divides the contacts into short and long subsets (relative length along the edge). Thus, notch 35 divides upper edge contacts 25 into a short subset 25a and a long subset 25b, and divides lower edge contacts 27 into a short subset 25a and a long subset 25b.

FIGS. 2A, 2B, 2C, and 2D are simplified top, bottom, module-receiving side, and back side views of a prior art DIMM socket 40. The socket includes a socket body 45, formed with a module-receiving recess 47, and module latches 50a and 50b. A key 55 is formed on the module-receiving side of the socket body, and effectively divides the module-receiving recess is into short and long segments, designated 45a and 45b.

The socket includes a set of upper contacts 60 and a set of lower contacts 62. The upper and lower contacts on the socket are offset in a manner consistent with the offset between the upper and lower pins on the DIMMs. As in the case of notch 35 dividing the sets of contacts on the DIMM, key 55 divides the upper set of contacts into a short subset 60a and a long subset 60b, and divides the lower set of contacts into a short subset 62a and a long subset 62b.

The upper contacts include respective first ends (not shown) located along the upper surface of recess 47 and respective second ends on a lower surface of the socket and extending away from the back side. The first ends are configured to engage DIMM pins 25 while the second ends are configured to engage pads on the circuit board to which the socket is to be mounted. The lower contacts include respective first ends (not shown) located along the lower surface of recess 47 and respective second ends on a lower surface of the socket and extending away from the module-receiving side. The first ends are configured to engage DIMM pins 27 while the second ends are configured to engage a different set of pads on the circuit board to which the socket is to be mounted.

It is also known in the prior art to provide DIMM sockets as shown, but in a double-decker configuration configured to accommodate two DIMMs, one lying in a plane above the other. There would be two module-receiving recesses, each with its respective sets of upper and lower contacts. It is noted that where the number of pins becomes significantly larger than 200, as for example a double-decker socket configured for two 144-pin DIMMs, the contact density would likely necessitate the use of ball grid array (BGA) technology rather than the surface mount technology illustrated for the case of a total of 144 contacts.

FIG. 3 is a simplified top view of a prior art configuration with a pair of prior art DIMMS 10a and 10b disposed in respective prior art sockets 40a and 40b on a motherboard 70. The sockets are spaced as close together as is practical, given the space constraints of the specific application, namely a laptop computer. The arrangement shown is certainly serviceable, but the inventors have recognized a number of potential shortcomings. First, to the extent that there are situations with tight timing constraints, signal routing on the motherboard requires closely matched interconnections for a given signal to reach corresponding pins on the two DIMMs at the same time. Further, there may be circumstances where it would be desired to upgrade using a higher-capacity DIMM. It is likely that the chips on the higher-capacity DIMM would be longer in the dimension perpendicular to the edge of the DIMM circuit board with the edge contact, thereby necessitating a larger circuit board along that dimension (the DIMM would still have the same edge contact configuration). This capability could only be accommodated by increasing the spacing of the sockets, which is at odds with the design goal of minimizing the usage of scarce motherboard area.

SUMMARY OF THE INVENTION

The present invention achieves improved motherboard layout within the context of using standard DIMMs. A motherboard using the invention can be laid out more efficiently while optimizing signal timing considerations; at the same time, the invention permits a flexible design that can accommodate larger DIMMs without an undue penalty in circuit board usage.

In short, the invention achieves its advantages by providing DIMM sockets in complementary pairs where their keys are in opposite locations. In specific embodiments, the first and second sockets in a pair are mirror images of each other. The sockets according to the present invention can be configured for single DIMMs (single-decker) or can be configured in a double-decker configuration. In general, any motherboard layout that uses single-decker sockets can easily be adapted to use double-decker sockets.

In circuit board layouts where both sockets are mounted on the same side of the motherboard, the sockets are disposed with their module-receiving recesses facing toward or away from each other, rather than in the same direction as in the prior art configuration. In this configuration, the respective keys are aligned. With such a pair of sockets, one of the DIMMs must be inserted upside down with respect to the other. The result is that where a particular pin on one DIMM engages an upper contact in the socket, the corresponding pin on the other DIMM engages the corresponding lower contact on the other socket. This difference is easily accommodated by minor rerouting of the interconnections on the motherboard since the ends of the upper and lower contacts that engage the motherboard are relatively close to each other.

The present invention also allows an advantageous layouts where the complementary sockets are disposed on opposite sides of the motherboard. In this type of layout, the respective keys are immediately opposite each other, and the two DIMMs have their upper sides facing in the same direction, albeit on opposite sides of the motherboard so that the upper side of one DIMM faces away from the motherboard and the upper side of the other DIMM faces toward the motherboard.

A further understanding of the nature and advantages of the present invention may be realized by reference to the remaining portions of the specification and the drawings.

BRIEF DESCRIPTION OF THE DRAWINGS

FIGS. 1A, 1B, and 1C are simplified top, bottom, and side views of a prior art DIMM;

FIG. 3 is a simplified top view of a pair of prior art DIMMS disposed in prior art sockets on a motherboard;

DESCRIPTION OF SPECIFIC EMBODIMENTS

Complementary DIMM Socket

Figure 2A:
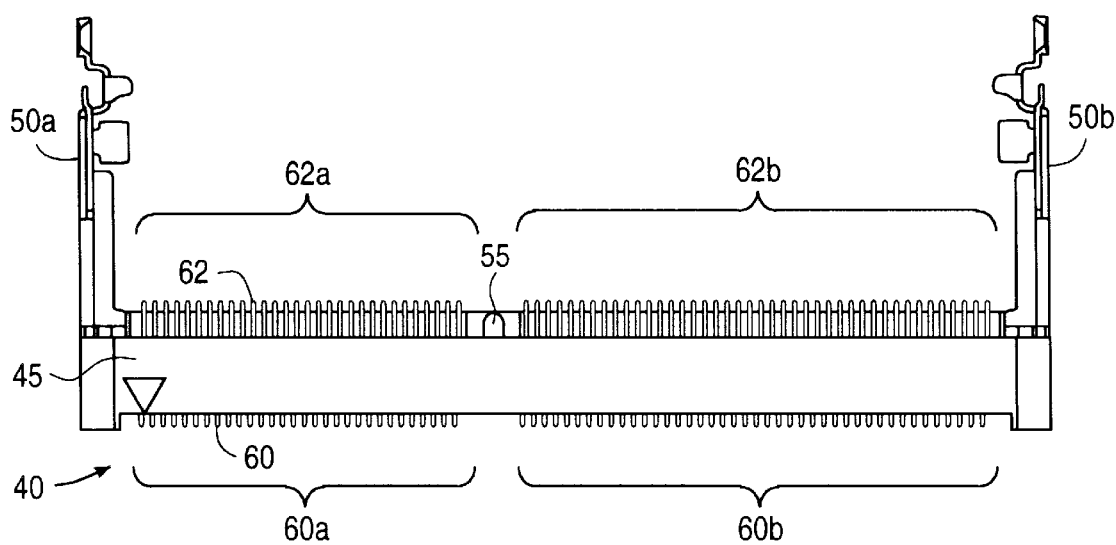
FIGS. 2A, 2B, 2C, and 2D are simplified top, bottom, module-receiving side, and back side views of a prior art DIMM socket.
Figure 2B:
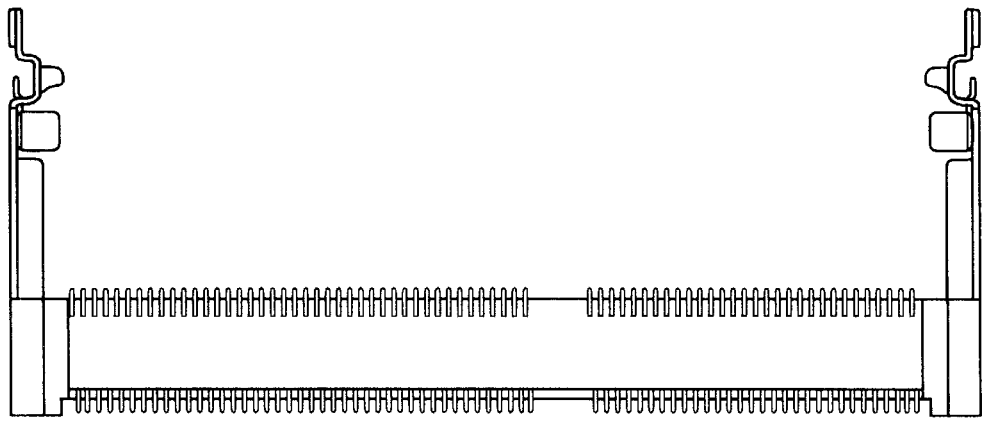
Figure 2C:
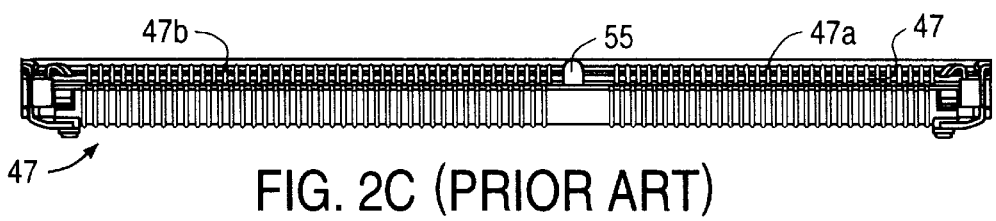
Figure 2D:
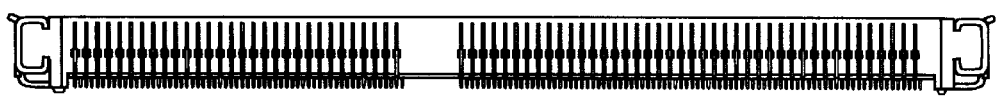

FIGS. 4A, 4B, 4C, and 4D are simplified top, bottom, module-receiving side, and back side views of a DIMM socket 40' according to an embodiment of the invention. Elements corresponding to those on prior art socket 40 are shown with corresponding primed reference numerals. As will be discussed below, socket 40' is intended to be used as one of a complementary pair where the other member of the pair is prior art socket 40.

Socket 40' includes a socket body 45', formed with a module-receiving recess 47', and module latches 50a' and 50b'. As in the prior art, the recess is effectively divided into short and long segments, designated 45a' and 45b', by an asymmetrically located key 55' on the module-receiving side of the socket body.

Socket 40' includes a set of upper contacts 60' and a set of lower contacts 62'. The upper contacts include respective first ends located along the upper surface of recess 47' and respective second ends on a lower surface of the socket and extending away from the back side. The lower contacts include respective first ends located along the lower surface of recess 47' and respective second ends on a lower surface of the socket and extending away from the module-receiving side. Key 55' divides the upper set of contacts into a short subset 60a' and a long subset 60b', and divides the lower set of contacts into a short subset 62a and a long subset 62b.

Figure 4A:
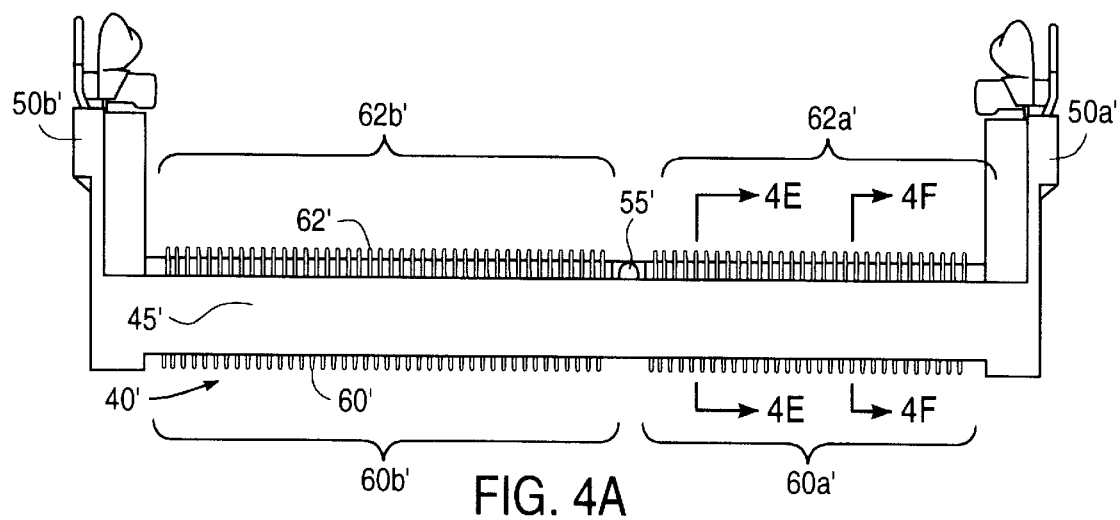
FIGS. 4A, 4B, 4C, 4D, 4E, and 4F are simplified top, bottom, module-receiving side, back side, first cross-sectional, and second cross-sectional views of a DIMM socket according to an embodiment of the invention.
Figure 4B:
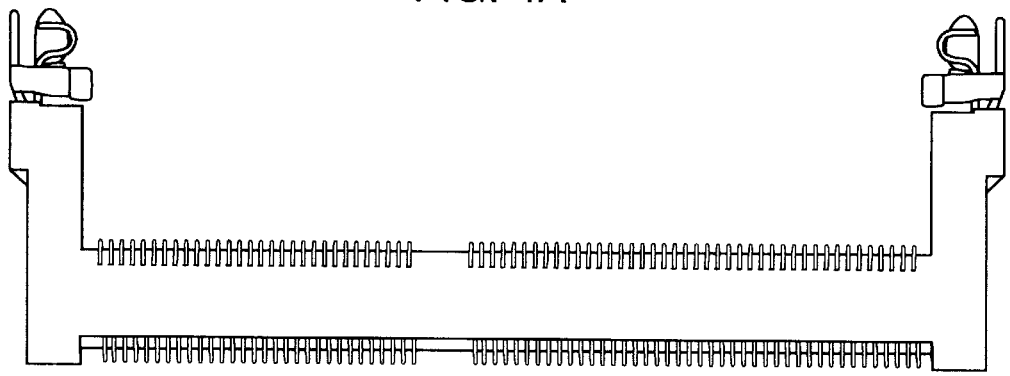
Figure 4C:
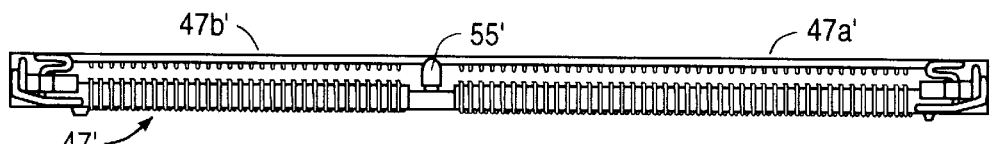
Figure 4D:
Figure 4E:
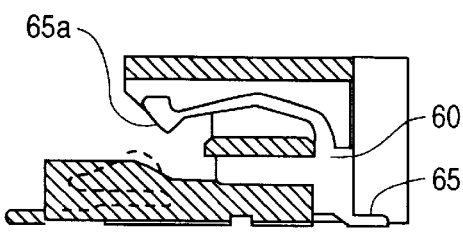
Figure 4F:
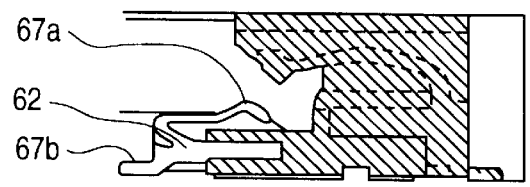

FIG. 4E is a cross-sectional view taken along section line 4E—4E of FIG. 4A, which section line passes between a pair of upper contacts so that one of upper contacts 60' appears in elevation. FIG. 4F is a cross-sectional view taken along section line 4F—4F of FIG. 4A, which section line passes between a pair of lower contacts so that one of lower contacts 62' appears in elevation. The upper contacts include respective first ends 65a located along the upper surface of recess 47 and respective second ends 65b on a lower surface of the socket and extending away from the back side. First ends 65a are configured to engage DIMM pins 25 while second ends 65b are configured to engage pads on the circuit board to which the socket is to be mounted. The lower contacts include respective first ends 67a located along the lower surface of recess 47 and respective second ends 67b on a lower surface of the socket and extending away from the module-receiving side. First ends 67a are configured to engage DIMM pins 27 while second ends 67b are configured to engage a different set of pads on the circuit board to which the socket is to be mounted.

Socket 40' is in all relevant respects the same as prior art socket 40, with which it is intended to used as one of a complementary pair, except that its configuration is a mirror image of the prior art socket. It is noted that socket 40' is intended for use with the same standard DIMMs that are used with socket 40, or at least DIMMs with the same pinout and notch. Accordingly, it is necessary to insert a DIMM into socket 40' upside down relative to the way the DIMM would be inserted into prior art socket 40.

It is noted that in the particular implementation, the mechanical design of module latches 50a' and 50b' of DIMM 40' is slightly different from that of module latches 50a and 50b of DIMM 40. This difference is not relevant to the present invention, and in other implementations, sockets 40 and 40' could have identical mechanical designs, or designs that are different from the two variations illustrated. What is relevant is that the keys of the two modules are offset in opposite directions to create mirror image configurations.

Layouts with Complementary DIMM Sockets on Same Side of Motherboard

Figure 5A:
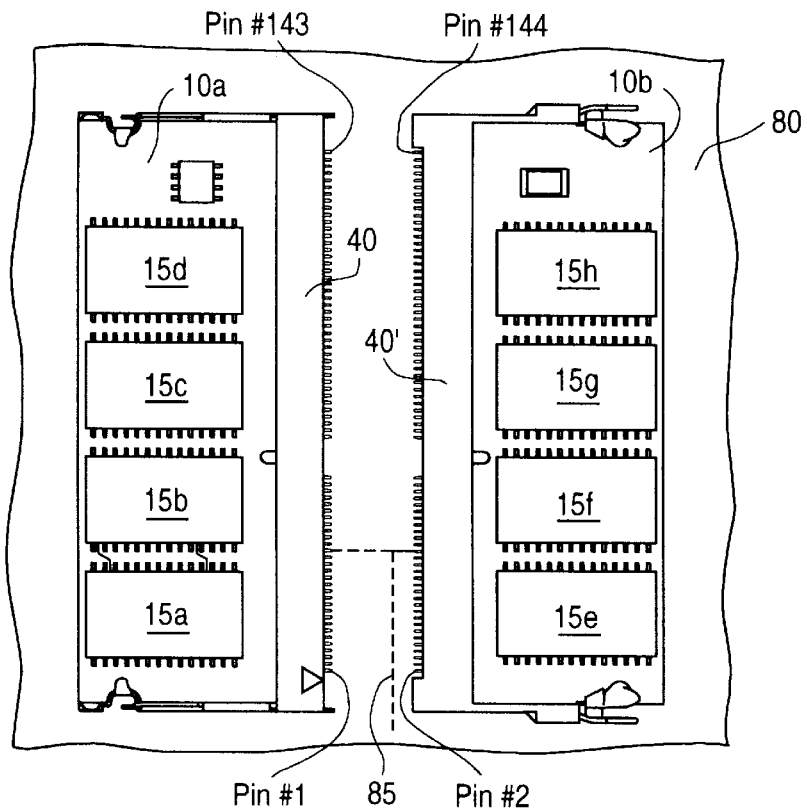
FIG. 5A is a simplified top view of a pair of prior art DIMMS disposed in a complementary pair of sockets on a motherboard according to a socket configuration of the invention with the sockets facing away from each other.

FIG. 5A is a simplified top view of a pair of prior art DIMMS 10a and 10b disposed in a complementary pair of sockets 40 and 40', respectively, on a motherboard 80 in a first configuration according to the invention. In this configuration, the sockets have their module-receiving recesses facing away from each other. The figure also shows, in phantom, a signal trace 85 for communicating a signal to pin #1 of each of the two DIMMs. In this configuration, DIMM 10a has its pin #1 on top, as in the prior art.

Since socket 40' is a mirror image, DIMM 10b has to be inserted upside down, and therefore has its pin #2 on top and its pin #1 (not visible in the figure) on the bottom. However, in this configuration, the socket contacts for corresponding pins on the two DIMMs are close to each other. Pin #1 for DIMM 10a is accessed by an upper contact of socket 40 while pin #1 for DIMM 10b is accessed by a lower contact of socket 40'. This is accomplished easily, for example, by having the vias for the upper pins on socket 40 terminate on the same circuit board layer as the vias for the lower pins on socket 40'. To account for the fact that the upper pins terminate on the back side of the socket and the lower pins terminate on the module-receiving recess side of the socket, trace 85 can be run slightly closer to socket 40' to balance the distances, although the difference in path length is generally negligible.

Figure 5B:
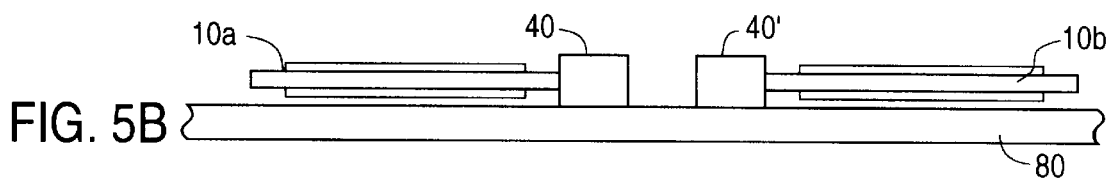
FIG. 5B is a highly simplified side view of the configuration of FIG. 5A.

FIG. 5B is a highly simplified side view (not drawn to scale) of the configuration of FIG. 5A. For simplicity, the socket latches are not shown.

Figure 6A:
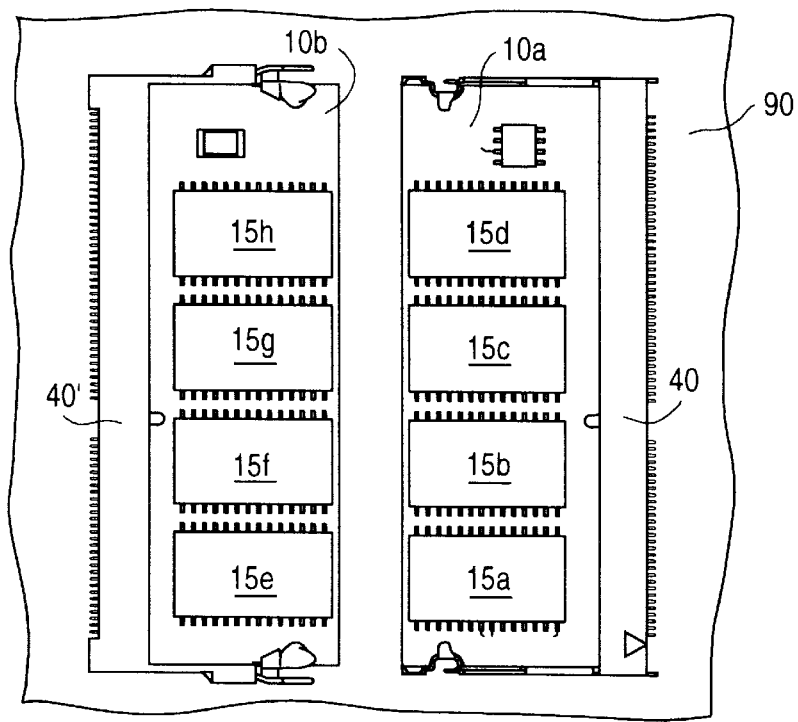
FIG. 6A is a simplified top view of a pair of prior art DIMMs disposed in a complementary pair of sockets on a motherboard according to a socket configuration of the invention with the sockets facing toward each other.
Figure 6B:
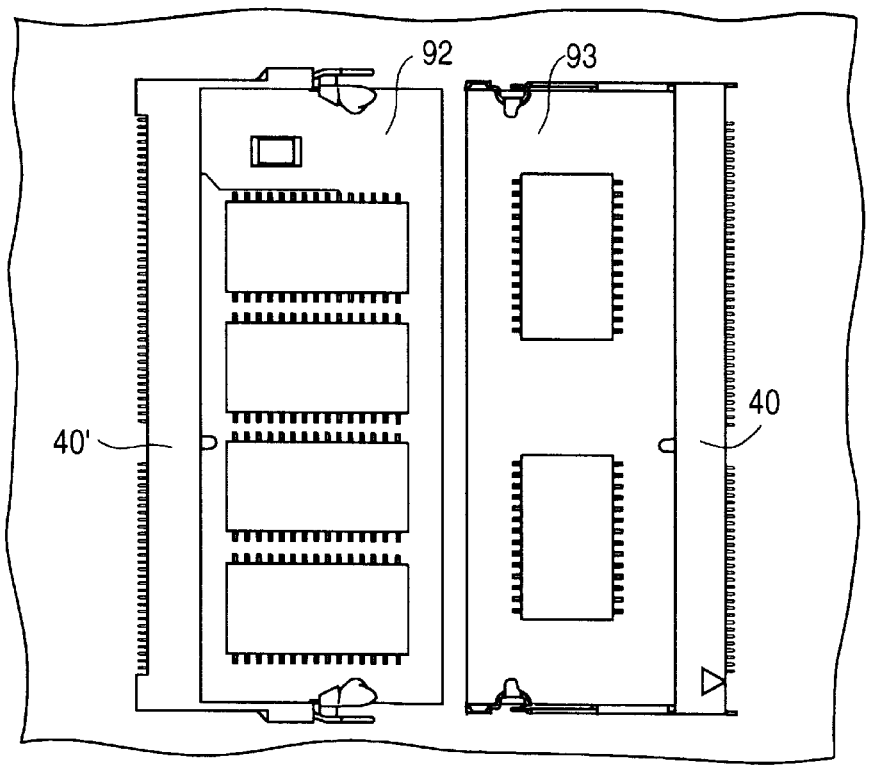
FIG. 6B is a simplified top view of an oversize prior art DIMM disposed in a complementary pair of sockets on a motherboard according to the socket configuration of FIG. 6A.

FIGS. 6A and 6B are simplified top view showing alternative uses of a complementary pair of sockets 40 and 40' on a motherboard 90 in a second configuration according to the invention. In this configuration, the sockets have their module-receiving recesses facing toward each other. The sockets are spaced to accommodate respective DIMMs 10a and 10b of the dimensions shown for DIMMs 10a and 10b in FIG. 3.

FIG. 6A shows the two sockets occupied by DIMMs 10a and 10b, with DIMM 10b in socket 40' upside down, as described above. FIG. 6B, on the other hand, shows an oversize DIMM 92 in socket 40' (it could just as easily be in socket 40) with DIMM 92 having geometrically larger chips and thus a larger dimension perpendicular to the edge along which the pins are disposed. This does not leave space for a second normal-size DIMM, but can accommodate a narrow DIMM 93 as shown.

This configuration, when used with the normal size DIMMs as shown in FIG. 6A, is as efficient as prior art configurations with the DIMM sockets facing in the same direction at a spacing to accommodate the DIMMs. However, this configuration is more versatile since it can accommodate an oversize DIMM as shown in FIG. 6B. To accomplish this in the prior art configuration, the socket spacing would have to be increased, thereby leaving unoccupied circuit board area when two of the normal size DIMMs are used.

Figure 6C:
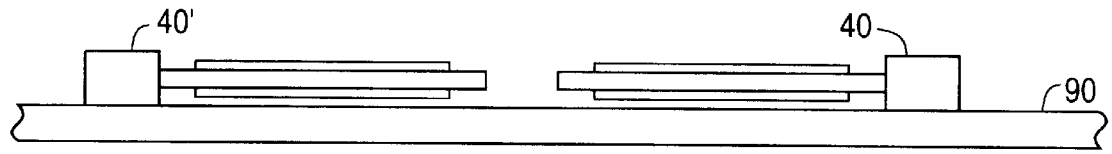
FIG. 6C is a highly simplified side view of the configuration of FIG. 6A.

FIG. 6C is a highly simplified side view (not drawn to scale) of the configuration of FIG. 6A. For simplicity, the socket latches are not shown.

Figure 7A:
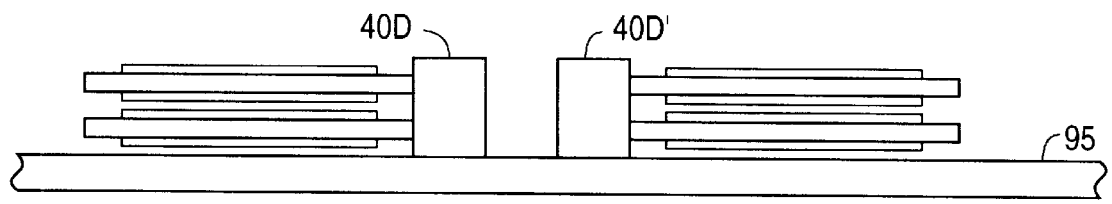
FIGS. 7A and 7B are highly simplified side views of configurations corresponding to those of FIGS. 5A and 6A, but with double-decker sockets.
Figure 7B:
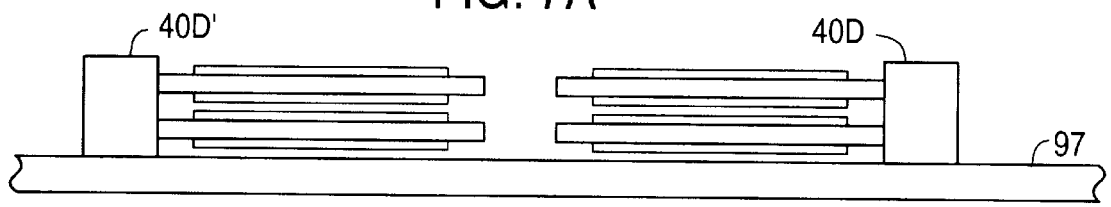

FIGS. 7A and 7B are highly simplified side views of configurations corresponding to those of FIGS. 5A and 6A, but with complementary double-decker sockets designated 40D and 40D' replacing complementary sockets 40 and 40' of FIGS. 5A and 6A.

Layouts with Complementary DIMM Sockets on Opposite Sides of Motherboard

Figure 8A:
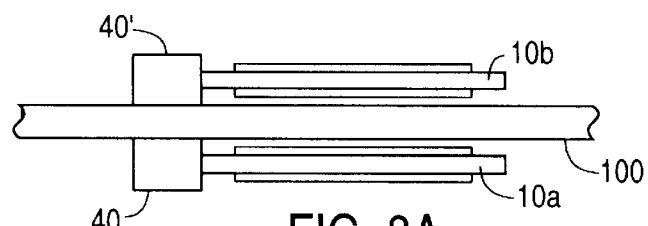
FIG. 8A is a highly simplified side view of a pair of prior art DIMMs disposed in a complementary pair of sockets on a motherboard according to a socket configuration of the invention where the sockets are on opposite sides of the motherboard.

FIG. 8A is a highly simplified side view of a pair of prior art DIMMs 10a and 10b disposed in a complementary pair of sockets 40 and 40' on a motherboard 100 according to a socket configuration of the invention where the sockets are on opposite sides of the motherboard. For definiteness, prior art socket 40 is inverted and mounted on the bottom of motherboard and complementary socket 40' is mounted on the top of the motherboard.

In this configuration, the respective keys are immediately opposite each other and the two DIMMs have their respective upper surfaces facing in the same direction. DIMM 10a, which is mounted to the inverted socket has what was referred to above as its upper surface facing down, away from the motherboard. DIMM 10b is inserted upside down, and so has its upper surface facing down, toward the motherboard.

Figure 8B:
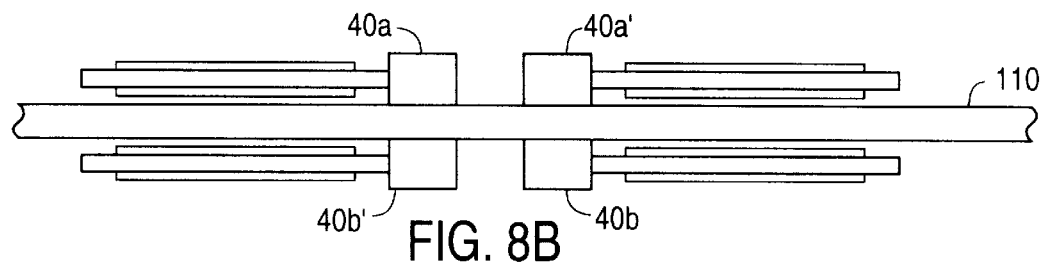
FIGS. 8B and 8C are highly simplified side views of configurations corresponding to those of FIGS. 5A and 5B, but with four DIMMs disposed in pairs of complementary sockets on opposite sides of the motherboard at shown in FIG. 8A.

FIG. 8B is a highly simplified side view of a configuration with four DIMMs disposed in complementary pairs of sockets on opposite sides of a motherboard 110. Specifically, a first complementary pair of sockets 40a and 40a' is mounted to the upper surface of motherboard 110 with their respective module-receiving recesses facing away from each other while a second complementary pair of sockets 40b and 40b' is mounted to the lower surface of motherboard 110 with the respective module-receiving recesses facing away from each other. As in the configurations of FIGS. 5A and 8A, the keys are located close to each other. That is the keys of sockets 40a and 40a' are directly across from each other and are directly opposite the keys of sockets 40b and 40b'.

Figure 8C:
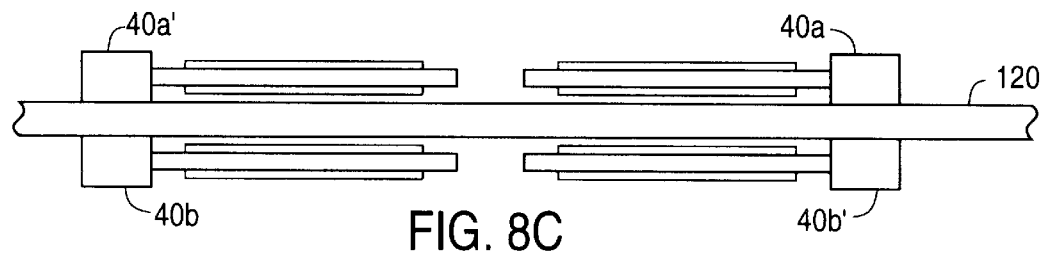

FIG. 8C is a highly simplified side view of a configuration with four DIMMs disposed in complementary pairs of sockets on opposite sides of a motherboard 120. The configuration corresponds to that of FIG. 8B, but the module-receiving recesses face toward each other.

Figure 8D:
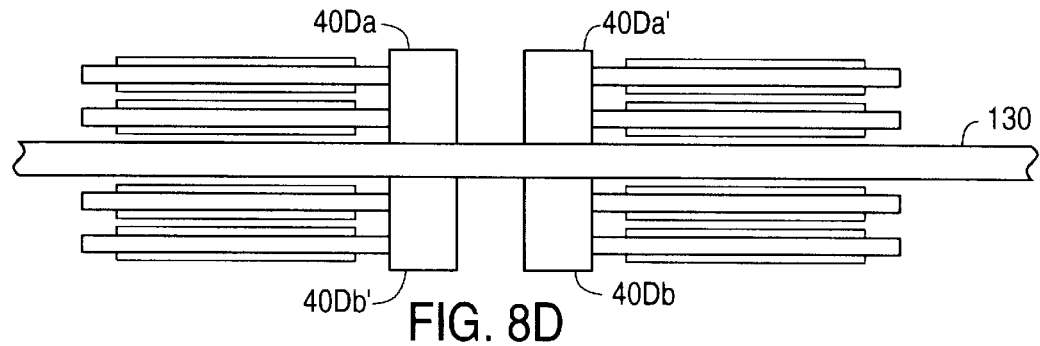
FIGS. 8D and 8E are highly simplified side views of configurations corresponding to those of Figs. 8B and 8C, but with double-decker sockets.

FIGS. 8D is a highly simplified side view of a configuration with eight DIMMs disposed in complementary pairs of double-decker sockets on opposite sides of a motherboard 130. Specifically, a first complementary pair of sockets 40Da and 40Da' is mounted to the upper surface of motherboard 130 with the respective module-receiving recesses facing away from each other while a second complementary pair of sockets 40Db and 40Db' is mounted to the lower surface of motherboard 130 with the respective module-receiving recesses facing away from each other.

Figure 8E:
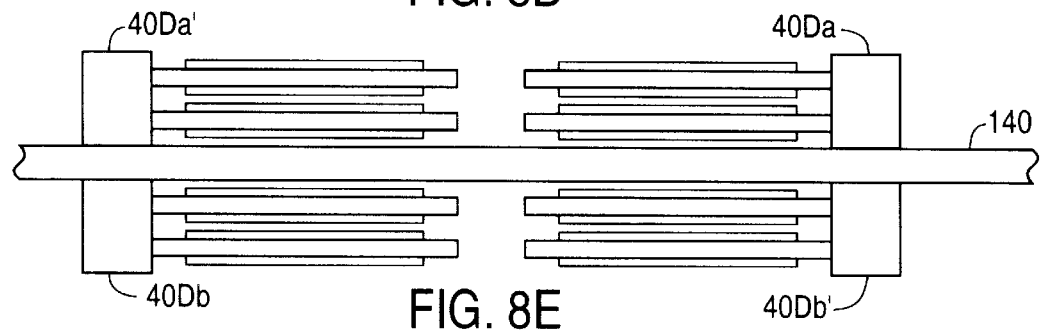

FIG. 8E is a highly simplified side view of a configuration with eight DIMMs disposed in complementary pairs of sockets on opposite sides of a motherboard 140. The configuration corresponds to that of FIG. 8D, but the module-receiving recesses face toward each other.

Figure 8F:
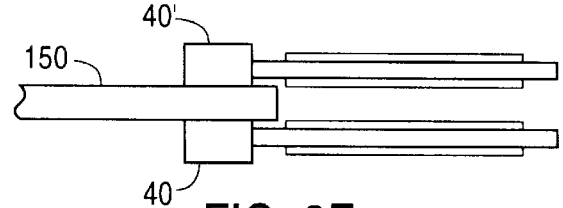
FIG. 8F is a highly simplified side view of a configuration similar to that of FIG. 8A, but with the sockets disposed near the edge of the motherboard and the DIMMs extending beyond the edge of the motherboard.

FIG. 8F shows a configuration similar to that of FIG. 8A, but with a complementary pair of sockets 40' and 40 disposed on opposite sides, and near the edge of a motherboard 150 with the DIMMs extending beyond the edge of the board. This configuration is suitable for a situation where there is no area on the motherboard available, or where clearances are such that it is necessary to mount the DIMMs closer to the medial surface of the motherboard. This is shown schematically by having the sockets of lower profile so that the DIMMs have their facing surfaces separated by a distance slightly less than the thickness of motherboard 150.

Conclusion

In conclusion, it can be seen that the present invention provides a simple and elegant solution to certain circuit board layout problems while allowing the use of standard modules. While the invention requires a mirror image socket, this is a small adaptation compared to having to have non-standard modules. As mentioned above, the various configurations can be implemented with single-decker and double-decker sockets, and with sockets on both sides of the motherboard.

While the above is a complete description of specific embodiments of the invention, various modifications, alternative constructions, and equivalents may be used. For example, the specific embodiment is for DIMMs, but the invention would find applicability for SIMMs which had to be mounted in a plane parallel to the motherboard. Therefore, the above description should not be taken as limiting the scope of the invention as defined by the claims.

What is claimed is:

1. A computer motherboard comprising:
a circuit board;
first and second sockets mounted to said circuit board, each socket having a module-receiving portion with a key portion asymmetrically located with respect to said module-receiving portion to permit a complementarily keyed module to be inserted into the socket in only one of two possible orientations, at least one of said sockets configured to receive two modules;
said first and second sockets each being configured with their respective key portions in opposite asymmetric locations so that said first socket allows the module to be inserted in only a first of the two possible orientations and said second socket allows the module to be inserted in only a second of the two possible orientations; and
a set of conductive traces formed on or in said circuit board for providing electrical connections to modules inserted in said sockets.

2. The motherboard of claim 1 wherein at least one of said sockets is configured to accommodate two modules.

3. The motherboard of claim 1 wherein at least one of said sockets is configured to accommodate only a single module.

4. The motherboard of claim 1 wherein said sockets are mounted on the same side of said circuit board.

5. The motherboard of claim 1 wherein said sockets are mounted on opposite sides of said circuit board.

6. The motherboard of claim 1 wherein:
the modules are of a type having electrically distinct contacts on opposite sides; and
the set of conductive traces configured to accommodate the fact that modules in said first and second sockets are in different orientations.

7. The motherboard of claim 1 wherein:
said module-receiving portions are disposed so as to hold modules inserted thereinto generally parallel to said circuit board;
said sockets are mounted on opposite sides of said circuit board at positions proximate an edge of said circuit board with said module-receiving portions facing in a direction such that modules inserted in said sockets extend past said edge of said circuit board.

8. The motherboard of claim 1 wherein:
the modules are of generally plate-like configuration, each with first and second surfaces; and
said module-receiving portions are disposed so as to hold modules inserted thereinto generally parallel to said circuit board.

9. The motherboard of claim 7 wherein:
said sockets are disposed in proximity to and aligned with one another;
said module-receiving portions of said first and second sockets face away from each other with said key portions aligned;
when identical modules are received in said first and second sockets, the modules have corresponding surfaces facing in opposite directions; and
said sockets are generally between the modules.

10. The motherboard of claim 7 wherein:
said sockets are spaced apart from and aligned with one another;
said module-receiving portions of said first and second sockets face towards each other with said key portions aligned;
when identical modules are received in said first and second sockets, the modules have corresponding surfaces facing in opposite directions; and
the modules are generally between said sockets.

11. A computer motherboard comprising:
a circuit board;
first and second DIMM sockets mounted to said circuit board, each socket configured to receive at least one DIMM module, at least one of said sockets configured to receive two modules, each socket having
an elongate module-receiving portion with first and second sets of socket contacts disposed along opposite edges of said module-receiving portion to engage complementary first and second sets of module contacts, and a key portion asymmetrically located with respect to said module-receiving portion to permit a complementarily keyed module to be inserted into the socket in only one of two possible orientations;

said first and second sockets each being configured with their respective key portions in opposite asymmetric locations so that said first socket allows the module to be inserted in only a first of the two possible orientations and said second socket allows the module to be inserted in only a second of the two possible orientations; and a set of conductive traces formed on or in said circuit board for providing electrical connections to modules inserted in said sockets, the set of conductive traces configured to accommodate the fact that modules in said first and second sockets are in different orientations.

12. The motherboard of claim 11 wherein at least one of said sockets is configured to accommodate two modules.

13. The motherboard of claim 11 wherein at least one of said sockets is configured to accommodate only a single module.

14. The motherboard of claim 11 wherein said sockets are mounted on the same side of said circuit board.

15. The motherboard of claim 14, and further comprising third and fourth sockets, mounted to the opposite side of said circuit board.

16. The motherboard of claim 11 wherein:

the modules are of a type having electrically distinct contacts on opposite sides; and the set of conductive traces configured to accommodate the fact that modules in said first and second sockets are in different orientations.

17. The motherboard of claim 11 wherein:

the modules are of generally plate-like configuration, each with first and second surfaces; and said module-receiving portions are disposed so as to hold modules inserted thereinto generally parallel to said circuit board.

18. The motherboard of claim 17 wherein:

said sockets are disposed in proximity to and aligned with one another;

said module-receiving portions of said first and second sockets face away from each other with said key portions aligned;

when identical modules are received in said first and second sockets, the modules have corresponding surfaces facing in opposite directions; and said sockets are generally between the modules.

19. The motherboard of claim 17 wherein:

said sockets are spaced apart from and aligned with one another;

said module-receiving portions of said first and second sockets face towards each other with said key portions aligned;

when identical modules are received in said first and second sockets, the modules have corresponding surfaces facing in opposite directions; and the modules are generally between said sockets.

20. A computer motherboard comprising:

a circuit board;

first and second sockets mounted on opposite sides of said circuit board, each socket having a module-receiving portion with a key portion asymmetrically located with respect to said module-receiving portion to permit a complementarily keyed module to be inserted into the socket in only one of two possible orientations, said module-receiving portions disposed so as to hold modules inserted thereinto generally parallel to said circuit board;

said first and second sockets each being configured with their respective key portions in opposite asymmetric locations so that said first socket allows the module to be inserted in only a first of the two possible orientations and said second socket allows the module to be inserted in only a second of the two possible orientations; and a set of conductive traces formed on or in said circuit board for providing electrical connections to modules inserted in said sockets.

* * * * *